United States Patent
Hamamoto

(12) 
(10) Patent No.: US 6,505,325 B1
(45) Date of Patent: Jan. 7, 2003

(54) PATTERN DATA DENSITY INSPECTION APPARATUS AND DENSITY INSPECTION METHOD AND RECORDING MEDIUM STORING PATTERN DATA DENSITY INSPECTION PROGRAM

(75) Inventor: Takeshi Hamamoto, Tokyo (JP)

(73) Assignee: NEC Corporation, Tokyo (JP)

( * ) Notice: Subject to any disclaimer, the term of this patent is extended or adjusted under 35 U.S.C. 154(b) by 194 days.

(21) Appl. No.: 09/615,450

(22) Filed: Jul. 13, 2000

(30) Foreign Application Priority Data

Aug. 20, 1999 (JP) .......................................... 11-234788

(51) Int. Cl.[7] ................................................ G06F 9/45
(52) U.S. Cl. ................................... 716/5; 716/4; 716/6
(58) Field of Search ........................... 716/1–21; 430/5, 430/30

(56) References Cited

U.S. PATENT DOCUMENTS 5,682,323 A * 10/1997 Pasch et al. .................. 716/19
6,077,310 A * 6/2000 Yamamoto .................... 716/19

FOREIGN PATENT DOCUMENTS

| JP | 54-9739 | 1/1979 |
| JP | 6-124320 | 5/1994 |
| JP | 9-62731 | 3/1997 |
| JP | 11-126825 | 5/1999 |

* cited by examiner

Primary Examiner—Matthew Smith
Assistant Examiner—Naum Levin
(74) Attorney, Agent, or Firm—Choate, Hall & Stewart

(57) ABSTRACT

A pattern density inspection apparatus is provided which improves the detection accuracy of a pattern data density error region, and outputs detection results for a designer to efficiently perform a correction operation without performing detection of pattern data density error regions which do not require correction. A control section 1 reads out layout data from a layout storage section 2, and stores this in an input processing section 3 and an output processing section 7. A data density computation processing section 4, while displacing layout data of the input processing section 3 from a position where pattern data was computed immediately before, in either one of an X axis direction and a Y axis direction, performs computations of the pattern density in the detection range after movement, and judges if the pattern data density is above 50%, and makes that above 50% a temporary error region. An error overlap removal processing section 5 takes a logical sum of temporary error regions, and creates an aggregate temporary error region. An error region width computation processing section 6 judges if an aggregate temporary error region is an error shape which contains a 400 $\mu$m square error judgment reference shape.

19 Claims, 8 Drawing Sheets

PATTERN DATA DENSITY INSPECTION APPARATUS AND DENSITY INSPECTION METHOD AND RECORDING MEDIUM STORING PATTERN DATA DENSITY INSPECTION PROGRAM

BACKGROUND OF THE INVENTION

1. Field of the Invention

The present invention relates to a pattern data density inspection apparatus for inspecting the density of mask layout data in a pattern layout for a semiconductor device.

2. Background Art

Recently, with the progress in miniaturization of semiconductor devices, tolerances in dimensional accuracy of the layout design, that is to say, manufacturing error tolerances such as in the width and pitch of the line pattern, in the contrast, and in the dimensions in the height direction have become small so that if there is not sufficient flatness in the interlayer insulation film between multilayer wiring, manufacture of the semiconductor device becomes impossible. That is to say, as shown in FIG. 6, the surface of an interlayer insulation film I1 on an upper portion of a wiring pattern P1 formed on a substrate S surface, is formed naturally higher than other regions. In the case where a next layer wiring pattern is formed on the surface of this interlayer insulation film I1, reliability is impaired due for example to the wiring pattern of the next layer becoming severe at a step portion E1 of the interlayer insulation film I1, and the width of the pattern wiring being formed narrow, so that with the passing of time, this narrow portion becomes disconnected by electro-migration.

Furthermore, the surface shape of the interlayer insulation film formed on the upper portion of the pattern wiring, changes due to the value of the wiring width. As shown in FIG. 7, a step E2 of an interlayer insulation I2, formed on the substrate S surface, compared to the step E1 shown in FIG. 6, has a restrictive shape with respect to formation of the next wiring pattern. Therefore, in order to prevent the occurrence of the above mentioned disconnection and the like of the wiring pattern of the next layer and the upper layer, a planarization technique for the interlayer insulation film involving CMP (Chemical Mechanical Polishing) or the like is used. Here, FIG. 6 (and FIG. 7) are sectional views of a semiconductor device showing a configuration example of an interlayer insulation film I1 (interlayer insulation film I2) formed when a pattern P1 (pattern P2) is on the bottom layer.

However, with the above mentioned planarization technique, the interlayer insulation film cannot be completely planarized. That is, as shown in FIG. 8, in the case where the width of the wiring pattern P1 is narrow, the difference in level is removed. However, in the case where the width of the wiring pattern P2 is wide, a small difference in level remains This difference in level is referred to as a global difference. Therefore, while with the dimensional accuracy in the layout design of conventional semiconductor devices, it is possible to cope with the remaining global difference, with the progress of miniaturization, this remaining difference in level has become a shape having a height which cannot be disregarded. Here, a distance between the surface of an interlayer insulation film I3 on an upper portion of the wiring pattern P2, and the surface of an interlayer insulation film I3 on an upper portion of the substrate S, that is to say the height of the global difference, is made dg. Here FIG. 8 is a sectional view of a semiconductor device showing a configuration example of an interlayer insulation film I3 which is formed when a pattern P1, a pattern P2 and a pattern P3 are the lower layer.

For example, as shown in FIG. 8, in the case where the wide wiring patterns P2 and P3 are formed adjacent, the interlayer insulation film I3 is formed with a skirt with a difference in level, on the upper portion of the wiring pattern P2 and the wiring pattern P3. Hence this is formed with a thickness including the height of the global difference, on the surface of the substrate S between the wiring pattern P2 and the wiring pattern P3. Consequently, the thickness of the interlayer insulation film for the substrate surface becomes non uniform.

Therefore, the etching depth in the interlayer insulation film I3, for a contact hole CT1 for a dispersion layer D1 formed on the substrate S surface, and a contact hole CT2 for a dispersion layer D2 formed on the substrate S surface differs. That is to say, when the contact hole CT2 reaches the surface of the dispersion layer D2, the contact hole CT1 has not yet reached the surface of the dispersion layer D1.

Consequently, in the case where the etching of the interlayer insulation film I3 is continued so that the contact hole CT1 reaches to the dispersion layer D1, over etching occurs with respect to the contact hole CT2. As a result, the contact hole CT2 reaches the dispersion layer D2 surface and the dispersion layer D2 surface is then etched. Hence lattice defects occur bringing about a deterioration in electrical characteristics such as a drop in the breakdown resistance of the dispersion layer D2.

Since as mentioned above there is a limit to the planarization technique, it has been considered in the stage for layout design of the semiconductor memory device, to detect congested regions (pattern data density error regions) with wide wiring patterns which produce this global difference, to thus prevent the occurrence of global differences. For example the graph shown in FIG. 9 shows the experimentally obtained relationship between the width (X axis) of isolated aluminum wiring as a wiring pattern, and the height dg (Y axis) of the global difference. The change in global difference shown in the figure for an aluminum wiring width near 400 μm is large. Moreover, if the height is around this height dg, this can be permitted. At this time, in the design rule used for making the graph of FIG. 9, the thickness of the aluminum wiring is 600 nm, and the thickness of the interlayer insulation film is 800 nm.

Furthermore, in the region of a 400 μm square (400 μm×400 μm), if the area density of the aluminum wiring (the value for the total surface area of the aluminum wiring pattern divided by the area of the region; the pattern data density) becomes greater than 50%, it is confirmed experimentally that the condition is equivalent to the change in global difference for an aluminum wiring width near 400 μm. Furthermore, it is similarly obtained by experiment that when obtaining this area density, aluminum wiring where the wiring width is less than 1.2 μm can be ignored. Based on this result, a chip of a semiconductor device is divided into lattice shape detection regions and the pattern data density in each of the detection regions obtained. Then with a detection range where this pattern data density exceeds 50% as a pattern data density error region, a designer of a layout pattern considers processes to prevent the occurrence of global differences to obtain correction of the wiring pattern. Hereunder is a description of the process for detecting pattern data density error regions.

A description is given of a conventional pattern data density inspection apparatus based on the figures. FIG. 10 is a block diagram showing the construction of a conventional pattern data density inspection apparatus. A control section 100 reads out layout data for performing inspection, from a layout storage section 101 in which is stored a plurality of layout data, and writes the read out layout data to an input processing section 102 and an output processing section 104, where this is stored. This layout data is wiring pattern data, that is to say a wiring layer data file.

A density computation processing section 103, under instructions from the control section 100, divides the layout data stored in the input processing section 102 into lattice shape detection ranges, and performs pattern data density computations for each of the detection ranges. Furthermore, the density computation processing section 103 judges if the pattern data density for each of the detection ranges is above 50%. At this time, the density computation processing section 103 makes a color for detection ranges in the layout data stored in the output processing section 104, where the pattern data density is above 50%, that is to say the color for regions corresponding to pattern data density error regions, different from that for other normal regions, so that the pattern data density error region of the layout data is clear to a designer who performs correction of the layout. Then under instructions from the control section 100, the output processing section 104 outputs an image showing the pattern data density error region, from a printer (not shown in the figure) provided on the pattern data density inspection apparatus, or displays this on a CRT (cathode-ray tube)(not shown in the figure).

Next is a description of the operation of the conventional pattern data density inspection apparatus, with reference to FIG. 10 and FIG. 11. FIG. 11 is a flow chart showing the operation of the conventional pattern data density inspection apparatus.

In step S100, the control section 100 performs control of the operation of the pattern data density inspection apparatus, in accordance with a program stored in a memory comprising a CPU, a memory and the like. Furthermore, the control section 100 reads out layout data for performing inspection of the pattern data density, from the layout storage section 101, and writes the read out layout data to the input processing section 102 and the output processing section 104. Then, the control section 100 outputs to the density computation processing section 103, instructions to compute the pattern data density. As a result, the density computation processing section 103 divides the layout data stored in the input processing section 102 into lattice shape detection ranges.

Next, in step S101, the density computation processing section 103 performs computation of the pattern data density for each of the divided detection ranges.

Then, in step S102, the density computation processing section 103 judges if the pattern data density for each of the detection ranges is above 50%. That is to say, judges if the detection range is a pattern data density error region. At this time, in the case where the density computation processing section 103 judges that the detection range is a pattern data density error region, processing is advanced to step S103.

Next in step S103, the density computation processing section 103 makes the color of the region corresponding to the pattern data density error region in the layout data stored in the output processing section 104 different from that for other normal regions. Then, the output processing section 104 displays on the layout data, by means of the CRT, an image of the pattern data density error region, in a color which is clearly different compared to that for regions where the pattern data density is normal.

Furthermore, in step S102, the density computation processing section 103, in the case where the detection range is not a pattern data density error region, advances the processing to step S104.

Then, in step S104, the control section 100 judges if the density computation processing section 103 has computed the pattern data densities for all of the lattices in the detection range of the layout data stored in the input processing section 102, that is to say if the density computation processing section 103 has computed the pattern data density for all the detection ranges of the layout data, and performed judgment for pattern data density error regions for all of the detection ranges.

At this time, the control section 100, in the case where judgment has been performed with respect to the pattern data density error regions for all of the detection ranges, terminates the processing for the pattern data density detection, while in the case where the judgment for the pattern data density error regions for all of the detection ranges has not been performed, returns the processing to step S101, and continues the processing for the pattern data density detection.

However, with the above mentioned pattern data density inspection apparatus, since the above mentioned computation of the pattern data density, and the judgment of the pattern data density error region is performed by dividing the layout data as a detection range lattice (error judgment reference shape) of 400 $\mu$m squares as shown in FIG. 12, based on the experimental results shown in FIG. 9, there is the disadvantage in that the detection accuracy of the pattern data density error range is low.

That is to say, when as shown in FIG. 12, the pattern data density inspection apparatus performs detection of pattern data density error regions for a detection range lattice of 400 $\mu$m squares, in the case of a pattern data density error region R1, the pattern data density error region R1 overlaps the lattice of a divided detection range. Therefore, the pattern data density detection apparatus cannot detect the pattern data density error region R1 with the 400 $\mu$m square detection range.

On the other hand, in the case of the pattern data density error region R2, since the pattern data density error region R2 exists over a lattice of four divided detection ranges, the pattern data density of the pattern data density error region R2 is averaged in the four detection ranges. As a result, since each of the four detection ranges do not reach a value of the pattern data density for the pattern data density error range, the pattern data density inspection apparatus detects this as a normal range, and hence cannot detect the pattern data density error region R2.

In order to deal with this, instead of a detection range of 400 $\mu$m squares, it has been considered to use a detection range of 100 $\mu$m squares so that a rounding error for the pattern data density error region does not occur. This 100 $\mu$m square detection range, in order to detect regions of 400 $\mu$m square or more which produce a global difference having an influence on reliability, is a value which is obtained as a minimum area having significance for computing the pattern data density based on the design rule when obtaining the graph of FIG. 9 and on the experimental results of FIG. 9, and this changes naturally in the case where the design rule differs.

As a result, as shown in FIG. 14, by detection using the detection range of 100 $\mu$m squares, then compared to the case of the detection range of FIG. 12, in the pattern data density error region R5, in the region of a 400 $\mu$m square, pattern data density error regions R5A of 100 μm squares can be detected. Hence it can be seen that the detection accuracy for the pattern data density error region is improved compared to the case for the detection range of the 400 μm squares.

However, in improving accuracy by making the detection range 100 μm squares, a stand alone pattern data density error region R3 of a 100 μm square, and a stand alone pattern data density error region R4 of 100 μm×200 μm are detected. However, with the stand alone pattern data density error regions R3 and R4, regions of an area greater than the 400 μm square which produces the global difference having a height which is the cause of the drop in reliability, obtained from the experimental results shown in FIG. 9, deviate from the detection reference, being the pattern data density error region. Therefore, the inherent pattern data density error regions R3 and R4 are regions which should not be detected as images of pattern data density error regions in the detection results for the pattern data density.

Furthermore, even in the detection range for the above mentioned 100 μm squares, in practice, the detection accuracy of the pattern data density error region R5 cannot be said to be sufficient. This is because for portions R5A less than a 100 μm square and with high pattern data density connected to the pattern data density error region R5, since detection is limited to being carried out for the detection range of the 100 μm square, detection of a high accuracy for these portions cannot be expected. Therefore, while regions where the pattern data density is high, can be detected by making the detection ranges less than the 100 μm square, the pattern data density error regions R3 and R4 which are not judged as inherent pattern data density error regions become excessively detected. Therefore, the designer must perform correction operations while judging the places to be corrected, and the places not to be corrected. Hence a problem arises in that there is a drop in the efficiency of the correction operation for the layout pattern.

SUMMARY OF THE INVENTION

The present invention has come about under the above mentioned background, and provides a pattern density inspection apparatus which improves the detection accuracy of the pattern data density error region, and outputs detection results for a designer to efficiently perform a correction operation without performing detection of pattern data density error regions which do not require correction.

A pattern data density inspection apparatus according to the first aspect of the present invention comprises: a pattern data density computing device (for example, the data density computing section of the embodiment) for obtaining for each of predetermined distance displacements for overlapping detection ranges of a predetermined area, pattern data densities showing a ratio of a total area of pattern data for wiring inside these detection ranges to the area; a temporary error region detection device (for example, the error overlap removal processing section of the embodiment) for taking a logical sum of the detection ranges where the pattern data density is above a previously set threshold value, and obtaining a temporary pattern data density error region (for example, the temporary error region of the embodiment); and an error region detection device (for example, the error region width computation processing section of the embodiment) for making the temporary pattern data density error region (for example the aggregate temporary error region of the embodiment) of a shape completely containing a previously set pattern data density error figure in plan view, a pattern data density error region.

A pattern data density inspection apparatus according to a second aspect of the present invention is a pattern data density inspection apparatus according to the first aspect of the present invention, wherein an area of the pattern data for wiring which is less than a predetermined pattern width is excluded from the total area for obtaining the pattern data density.

A pattern data density inspection apparatus according to a third aspect of the present invention is a pattern data density inspection apparatus according to either one of the first and second aspects of the present invention, wherein the pattern data density computing device computes the pattern data density for each of the predetermined distance displacements of the detection ranges for either of an X direction and a Y direction.

A pattern data density inspection apparatus according to a fourth aspect of the present invention is a pattern data density inspection apparatus according to any one of the first through third aspects of the present invention, wherein there is provided an output device for outputting the pattern data density error region and another normal pattern data region, in different colors.

A pattern data density inspection method according to a fifth aspect of the present invention is a pattern data density inspection method having: a first step where a pattern data density computing device obtains for each of predetermined distance displacements for overlapping detection ranges of a predetermined area, a pattern data density showing a ratio of a total area of pattern data for wiring inside these detection ranges to the area; a second step where a temporary error region detection device takes a logical sum of the detection ranges where the pattern data density is above a previously set threshold value, and obtains a temporary pattern data density error region; and a third step where an error region detection device makes the temporary pattern data density error region of a shape completely containing a previously set pattern data density error figure in plan view, a pattern data density error region.

A pattern data density inspection method according to a sixth aspect of the present invention is a pattern data density inspection method according to the fifth aspect of the present invention, wherein an area of the pattern data for wiring which is less than a predetermined pattern width is excluded from the total area for obtaining the pattern data density.

A pattern data density inspection method according to a seventh aspect of the present invention is a pattern data density inspection method according to either one of the fifth and sixth aspects of the present invention, wherein the pattern data density computing device computes the pattern data density for each of the predetermined distance displacements of the detection ranges for either of an X direction and a Y direction.

A pattern data density inspection method according to an eighth aspect of the present invention is a pattern data density inspection method according to any one of the fifth through seventh aspects of the present invention, wherein there is provided an output device for outputting the pattern data density error region and another normal pattern data region, in different colors.

A recording medium according to a ninth aspect of the invention is a computer readable recording medium on which is recorded a pattern data density inspection program for performing pattern data density inspection using a pattern data density inspection apparatus according to the first aspects of the present invention, wherein the pattern data density inspection program performs on a computer: a process where a pattern data density computing device while effecting displacement for overlapping detection ranges of a predetermined area, obtains pattern data densities showing a ratio of a total area of pattern data for wiring inside these detection ranges to the area; a process where a temporary error region detection device takes a logical sum of the detection ranges where the pattern data density is above a previously set threshold value, and obtains a temporary pattern data density error region; and a process where an error region detection device makes the temporary pattern data density error region of a shape completely containing a previously set pattern data density error figure in plan view, a pattern data density error region.

DETAILED DESCRIPTION OF THE INVENTION

Hereunder is a description of embodiments of the present invention with reference to the drawings.

Figure 1:
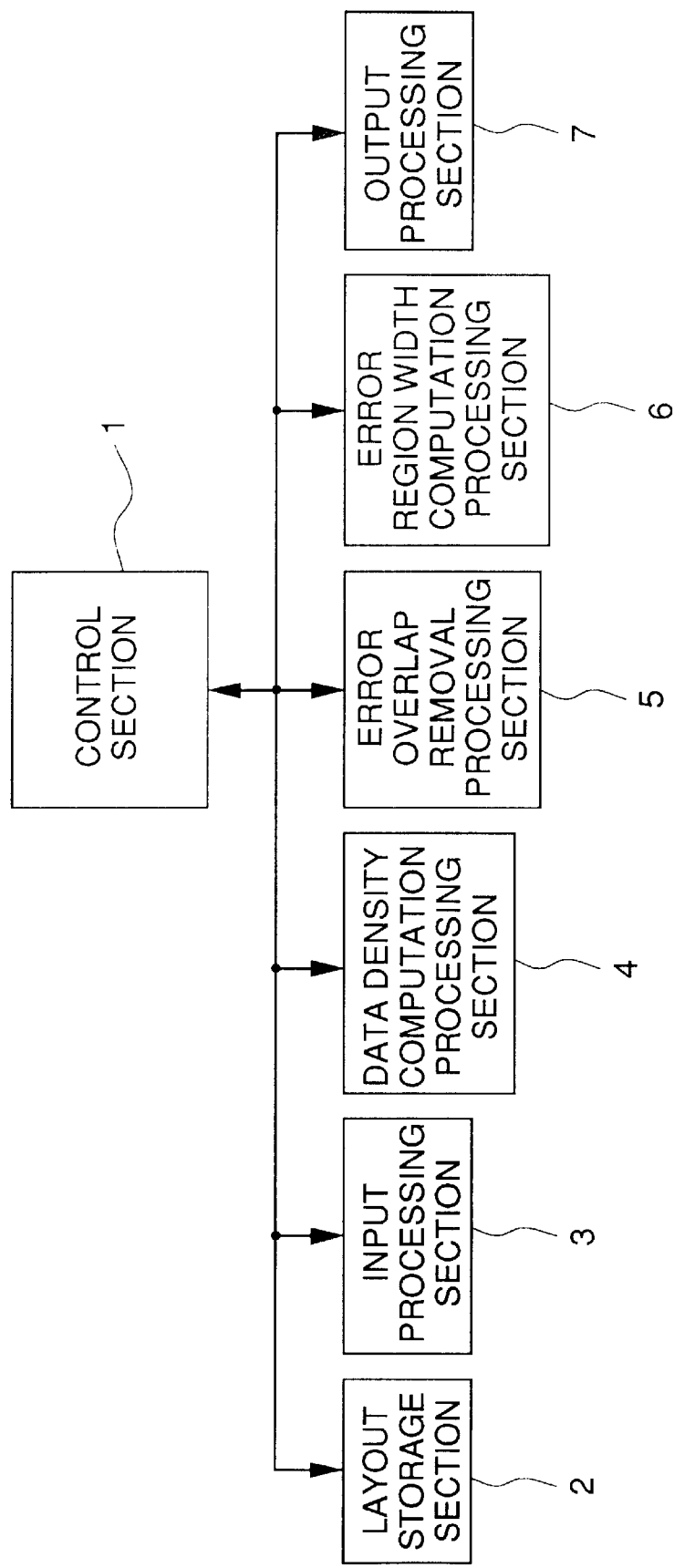
FIG. 1 is a block diagram showing a construction of a pattern data density inspection apparatus according to an embodiment of the present invention.

FIG. 1 is a block diagram showing a construction of a pattern data density inspection apparatus according to a first embodiment of the present invention. In this figure, a control section 1 comprises for example a CPU, a memory (storage section), and an input output device, and performs operations in accordance with a program stored in the memory. Moreover, the control section 1 reads out pattern layout data for performing inspection, from a layout storage section 2 in which is stored a plurality of pattern layout data, and writes the read out pattern layout data to an input processing section 3 and an output processing section 7, where this is stored. This pattern layout data is data such as for gate electrode wiring and wiring patterns, that is to say a wiring layer data file.

Figure 9:
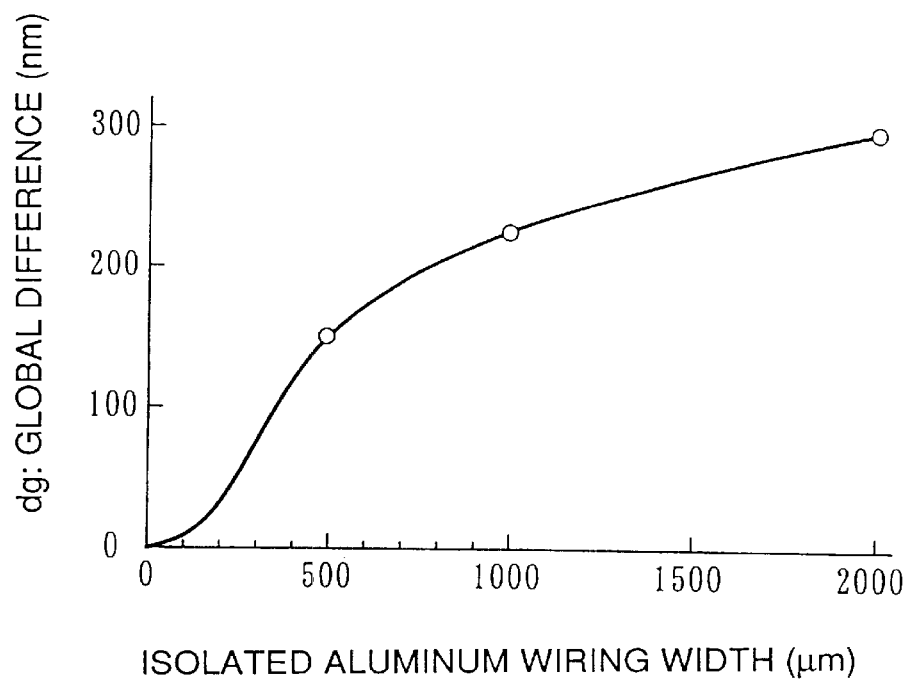
FIG. 9 is a graph illustrating a relationship between a numerical value for pattern width and a numerical value for global difference.
Figure 10:
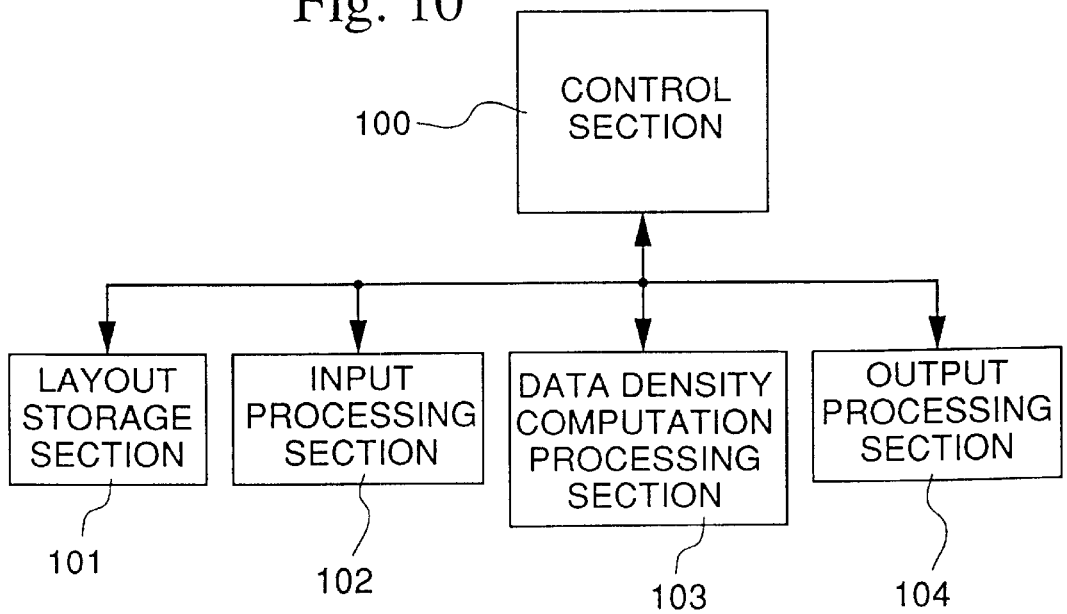
FIG. 10 is a block diagram showing a construction of a pattern data density inspection apparatus according to a conventional example.
Figure 11:
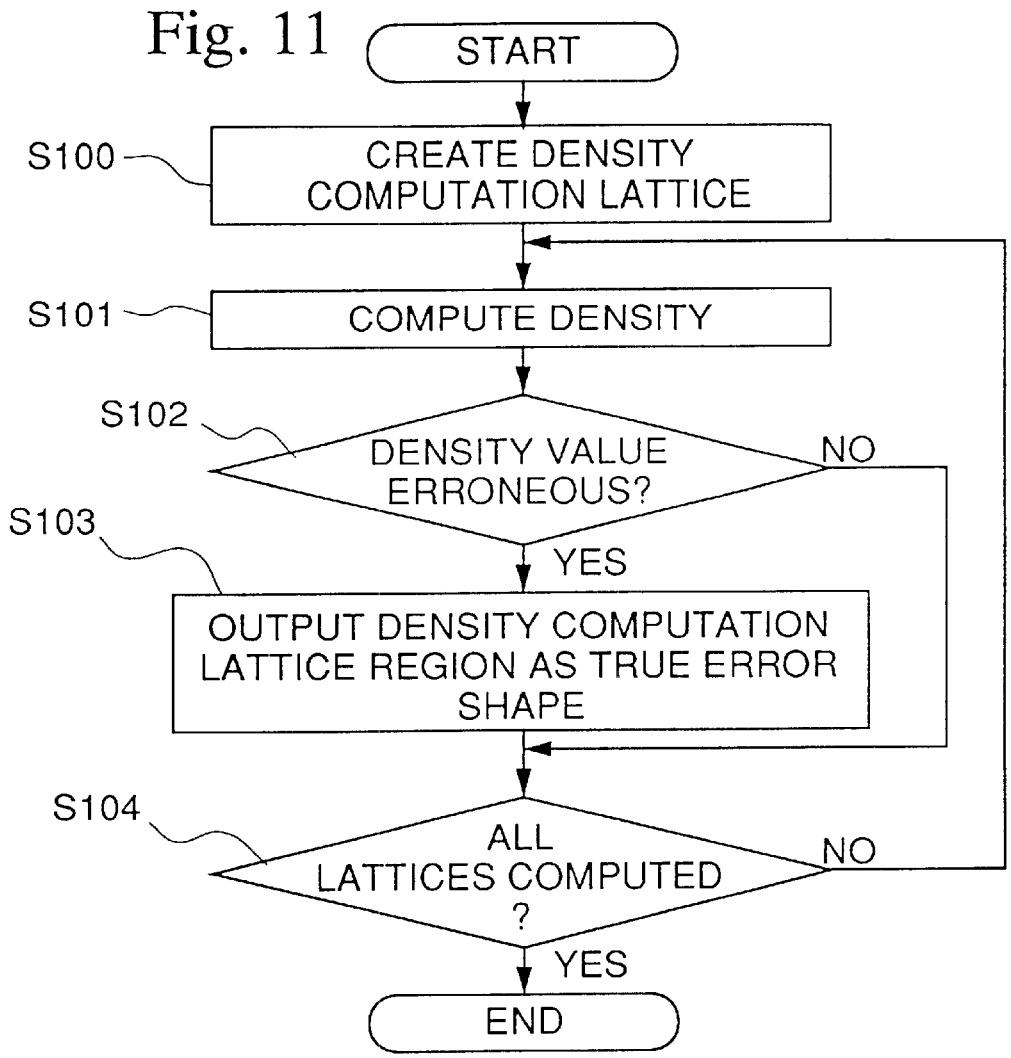
FIG. 11 is a flow chart for explaining an operation of the pattern data density inspection apparatus shown in FIG. 10.

A data density computation processing section 4, under instructions from the control section 1, performs pattern data density computations for pattern layout data stored in the input processing section 3 for predetermined shape detection ranges, for example for each 100 $\mu$m square detection range. This 100 $\mu$m square detection range, in the case of a design rule which creates the graph of FIG. 9 as shown in the conventional example, is a minimum value obtained as an area having significance for computing the pattern data density based on the current design rule and on the experimental results of FIG. 9, and this changes naturally in the case where the design rule differs.

Figure 2:
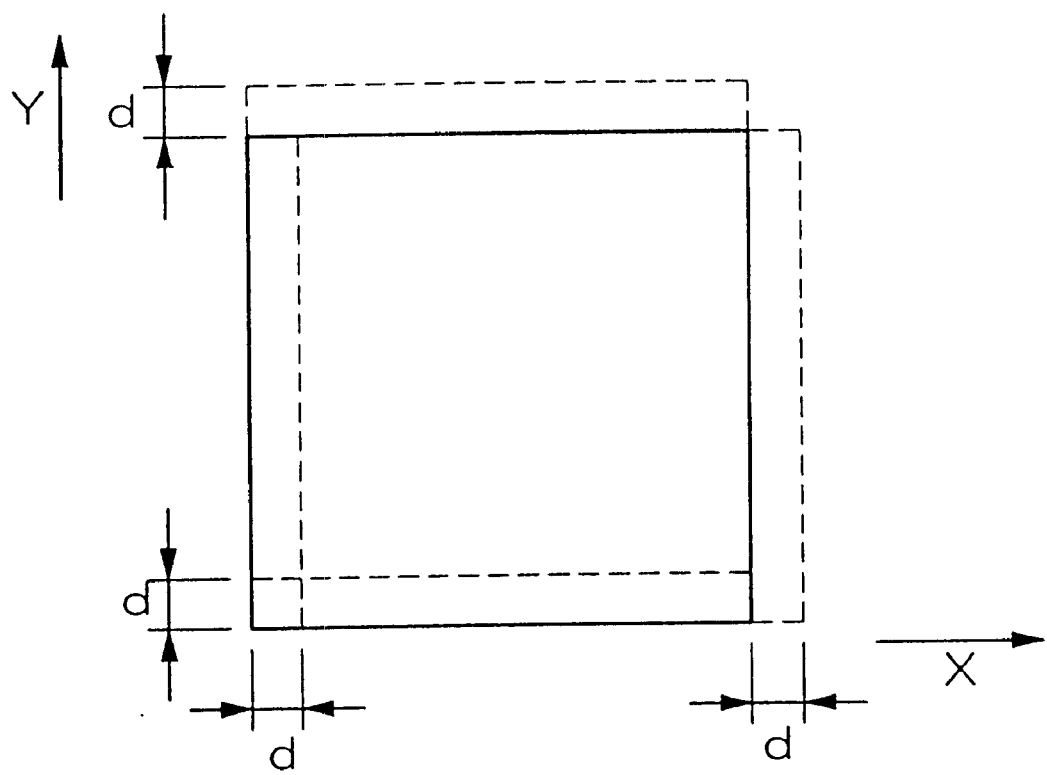
FIG. 2 is a conceptual diagram showing a movement method for a unit detection range for computing pattern data density.

Moreover, the data density computation processing section 4, while displacing the detection range by a predetermined distance, for example in 10 $\mu$m increments, from a position where the pattern layout data was computed immediately before, in either one of the X axis direction and the Y axis direction as shown in FIG. 2, sequentially performs computations of the pattern density in the detection range after movement.

Furthermore, the data density computation processing section 4 judges if the pattern data density of the displaced resultant detection range (100 $\mu$m square) as mentioned before is above 50%, and makes the detection range where the pattern density is above 50% a temporary error region. The error overlap removal processing section 5 superimposes temporary error regions obtained by the data density computation processing section 4, and takes the logical sum of the overlapped temporary error regions, and creates an aggregate temporary error region of a shape such as shown in FIG. 4.

Figure 4:
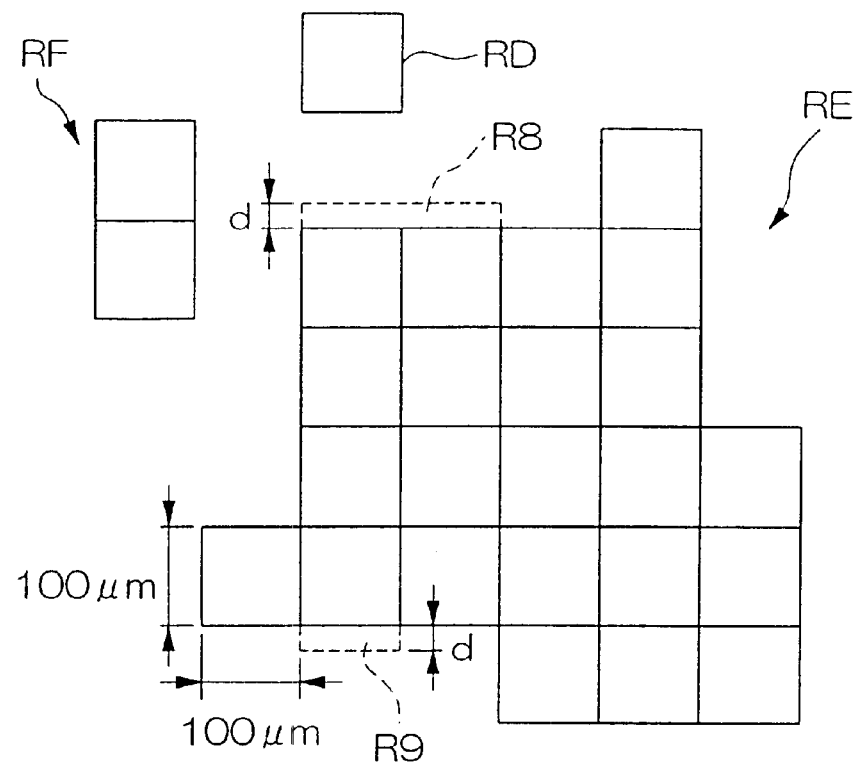
FIG. 4 is a conceptual diagram showing shape examples of aggregate temporary error regions output by an error overlap removal processing section 5 in FIG. 1.

FIG. 4 is a plan view showing aggregate temporary regions obtained by displacing in increments of 10 $\mu$m, a 100 $\mu$m square detection range in a pattern layout image face of a semiconductor integrated circuit, to obtain the pattern data density, and then taking the logical sum of the detection regions where the obtained pattern data density is above 50%. Here an aggregate temporary error region RE in FIG. 4 has a region R8 and a region R9 which are detected by displacing the detection range in 10 $\mu$m increments in the X axis direction or the Y axis direction, and obtaining the pattern data density for each detection range.

An error region width computation processing section 6 performs computation for judging if an aggregate temporary error region shown in FIG. 4 obtained from the error overlap removal processing section 5 is a region having an area and shape which has an influence with respect to the perimeter. That is to say, the data density computation processing section 4 judges if the aggregate temporary error region shown in FIG. 4 is an error shape containing a rectangular shape of 400 $\mu$m squares which can be assumed to detect a pattern data density error region.

At this time, the error region width computation processing section 6, since in the aggregate temporary error region shown in FIG. 4, the aggregate temporary error region RD and the aggregate temporary error region RF are a shape which does not contain the error judgment reference shape, rejects the aggregate temporary error region RD and the aggregate temporary error region RF as not corresponding to the pattern data density error region. Furthermore, the error region width computation processing section 6, since in the aggregate temporary error region shown in FIG. 4 the aggregate temporary error region RE corresponds to the pattern data density error region, detects this as a pattern data density error region RE shown in FIG. 5. Here, FIG. 5 is a plan view showing an aggregate error region, that is the pattern data density error region RE, being an aggregate of the detection ranges where, of the aggregate temporary error regions in a pattern data layout image face of a semiconductor integrated circuit, the pattern data density is above 50%, being of a size greater than the error judgment reference shape shown in FIG. 12.

Figure 5:
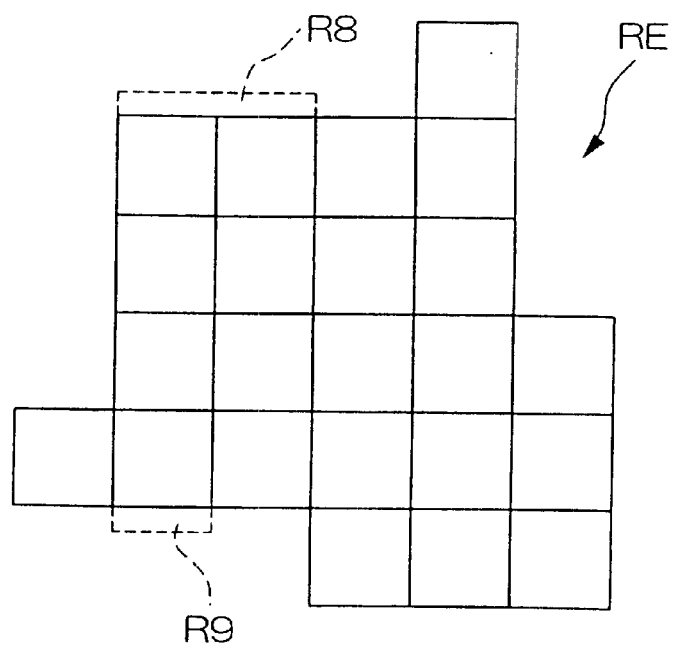
FIG. 5 is a conceptual diagram showing a shape example of a pattern data density error region output by an error region width computation processing section 6 in FIG. 1.
Figure 6:
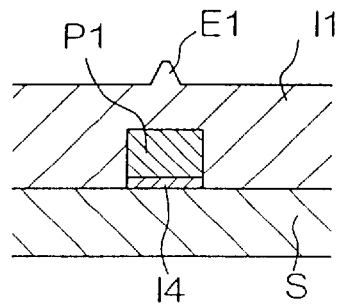
FIG. 6 is a sectional view of a semiconductor device illustrating a shape example of an interlayer insulation film formed when a pattern is a lower layer.
Figure 7:
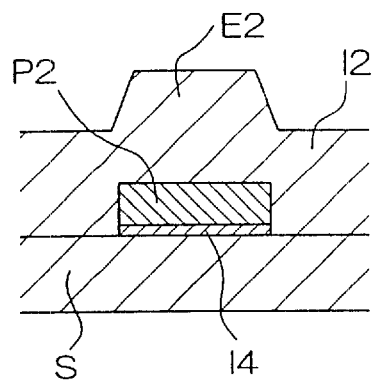
FIG. 7 is a sectional view of a semiconductor device illustrating a shape example of an interlayer insulation film formed when a pattern is a lower layer.
Figure 8:
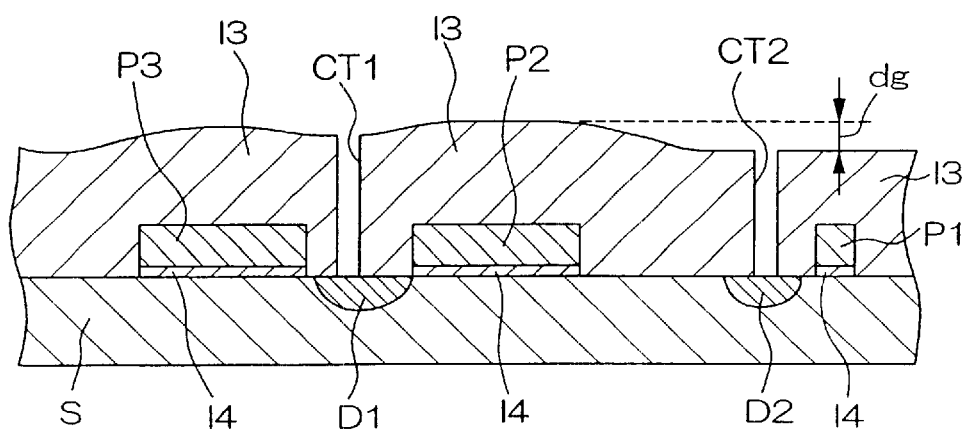
FIG. 8 is a sectional view of a semiconductor device illustrating a shape example of a global difference in an interlayer insulation film formed when a pattern is a lower layer.
Figure 12:
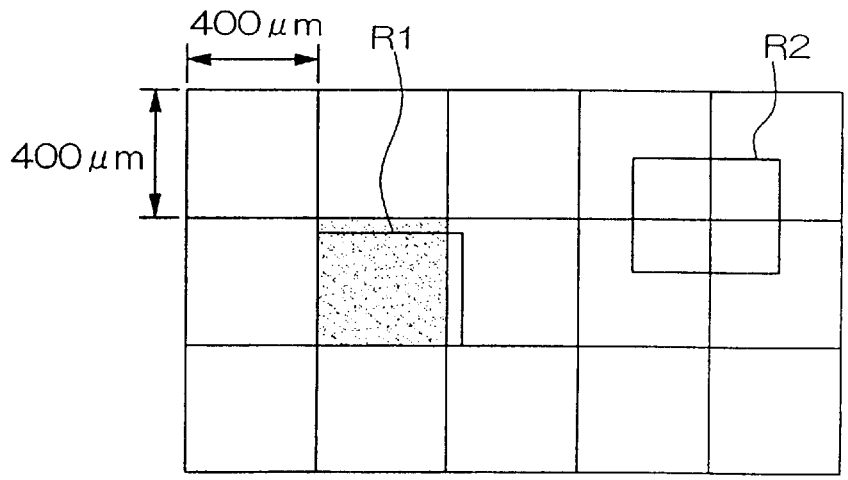
FIG. 12 is a conceptual diagram illustrating an error judgment reference shape.
Figure 13:
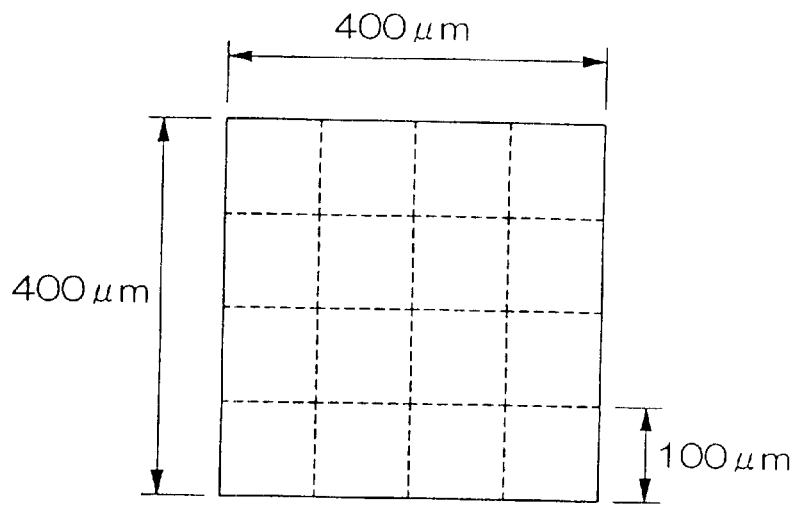
FIG. 13 is a conceptual diagram illustrating a shape of a pattern data density error region output by a conventional pattern data density inspection apparatus.
Figure 14:
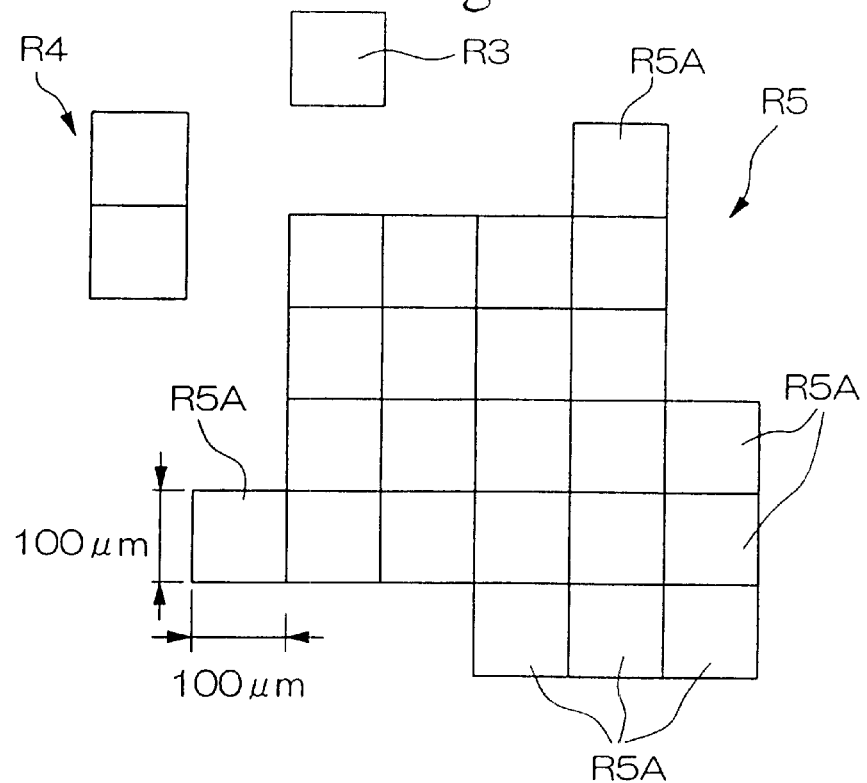
FIG. 14 is a conceptual diagram illustrating a shape of a pattern data density error region output by a conventional pattern data density inspection apparatus.

Furthermore, the error region width computation processing section 6, makes a color for detection ranges in the pattern layout data stored in the output processing section 7, where the pattern data density is above 50%, and aggregate error regions of a size larger than the error judgment reference shape shown in FIG. 12, that is to say the color of the region corresponding to the pattern data density error region RE shown in FIG. 5, different from that for other normal regions, so that the pattern data density error region of the pattern layout data is clear to a designer who performs correction of the layout. Then under instructions from the control section 1, the output processing section 7 outputs an image showing the pattern data density error region, from a printer (not shown in the figure) provided on the pattern data density inspection apparatus, or displays this on a CRT (not shown in the figure).

Figure 3:
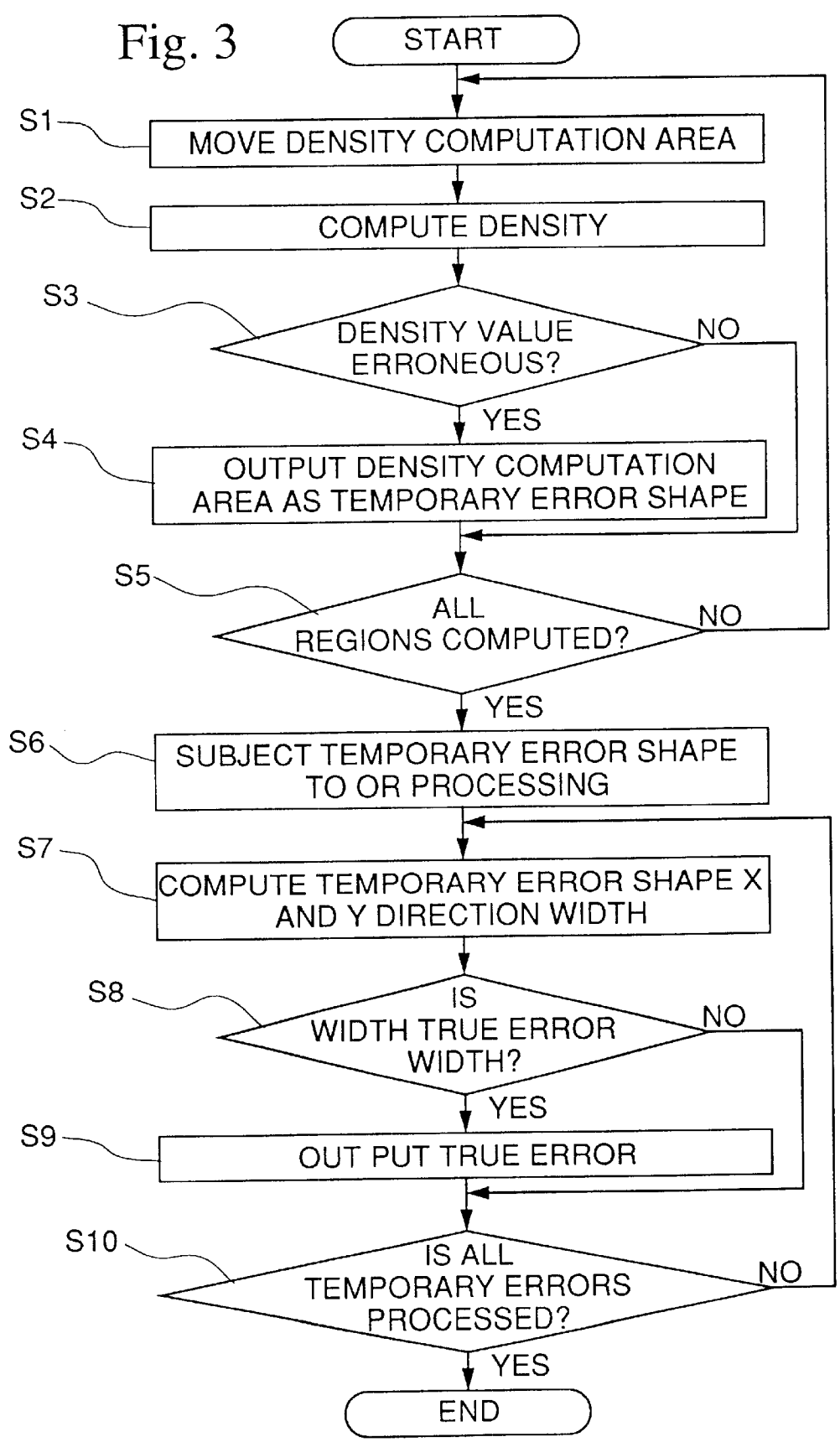
FIG. 3 is a timing chart for explaining an operational example of the pattern data density inspection apparatus shown in FIG. 1.

Next is a description of the operation of the pattern data density inspection apparatus according to the present invention with reference to FIG. 1 and FIG. 3. FIG. 3 is a block diagram showing an operation example of a pattern data density inspection apparatus of the present invention.

As an initial condition, the control section 1 reads out pattern layout data for performing inspection of the pattern data density, from a layout storage section 2 in accordance with a program stored in the memory, and writes the read out layout data to the input processing section 3 and the output processing section 7.

Next, in step S1, the control section 1 outputs to the data density computation processing section 4, instructions to perform computation of the pattern data density, for example with the upper left of the pattern layout data as the computation start point for the pattern data density. Moreover, the data density computation processing section 4, in the case where processing has returned from a later mentioned step 5, that is to say after computation processing has been completed for a detection range of a 100 µm square at the computation start point, displaces (moves) the detection range by 10 µm in the X direction, and advances the processing to step S2.

Furthermore, the data density computation processing section 4, sequentially, in the case where processing has returned from step 5 moves the detection range by 10 µm increments in the X direction, and when this comes to the X direction final point for the pattern layout data, moves the detection range by 10 µm in the Y direction, and when processing next returns from step 5, again moves the detection range by 10 µm increments in the X direction. By repeating this operation, the pattern data density for each of the detection ranges of the 100 µm squares after being displaced, is sequentially computed in step 2 for the whole of the pattern layout data. At this time, the data density computation processing section 4, in the case where the remaining movement distance for both the X direction and the Y direction is less than 10 µm, carries out movement for the remaining movement distance part, and computation for the pattern data density is thus performed in the data density computation processing section 4.

Next, in step S2, the data density computation processing section 4, based on instructions input from the control section 1 to perform computation of pattern data density, performs computation of the pattern data density for the 100 µm square detection range which has been moved by the control section 1, on the pattern layout data stored in the input processing section 3.

Next, in step S3, the data density computation processing section 4 judges for each detection range set by the control section 1, if the obtained pattern data density is above for example 50% which is previously set as a threshold value, that is to say, judges if the detection range is a pattern data density error region. Then, in the case where it is judged that the detection range is a pattern data density error region, the control section 1 advances the processing to step S4. On the other hand, at this time, in the case where it is judged that the detection range is not the pattern data density error region, the data density computation processing section 4 advances the processing to step S5.

Next, in step S4, the data density computation processing section 4, in the case where it is judged that the detection range is a pattern data density error region, makes this detection range a temporary error region, and advances processing to step S5.

Then, in step S5, the control section 1 judges if the detection range of the 100 µm square has been moved in 10 µm increments and the judgment processing for the temporary error region has been performed for all of the regions of the pattern layout data. Then, the control section 1, in the case where it is judged that the judgment processing for the temporary error regions has been performed for all of the regions of the pattern layout data, advances the processing to step S6. On the other hand, the control section 1, in the case where it is judged that the judgment processing for the temporary error region has not been performed for all of the regions of the pattern layout data, returns the processing to step S5 to continue the processing for the pattern data density computation.

Next, in step S6, the error overlap removal processing section 5, based on instructions from the control section 1 superimposes the temporary error regions output in step S4, and performs OR processing of the overlapped temporary error regions, that is, takes a logical sum, and produces an aggregate temporary error region of the shape shown in FIG. 4. Then, the control section 1 advances processing to step S7.

Next, in step S7, the error region width computation processing section 6, based on instructions from the control section 1, sequentially computes the width in the X direction (widthwise direction in the figure) and the Y direction (the longitudinal direction in the figure) respectively for the aggregate temporary error region RE, the aggregate temporary error region RD, and the aggregate temporary error region RF obtained in step S6, and advances processing to step S8. For example, the error region width computation processing section 6 computes the width in the X direction and Y direction of the aggregate temporary error region RE, and then advances processing to step S8.

Then, in step S8 the control section 1, based on the width in the X direction and the Y direction of the aggregate temporary error region RE obtained by the error region width computation processing section 6, successively judges if this aggregate temporary error region RE has a size greater than the 400 μm square (the error judgment reference shape) being the previously set pattern data density error region. That is to say, the control section 1 judges if the width in the X direction and the Y direction of the aggegate temporary error region RE are both greater than 400 μm (the true error width).

At this time, the control section 1, since the widths in the X direction and the Y direction of the aggregate temporary error region RE are both above 400 μm, that is, have a size greater than the 400 μm square being the pattern data density error region, advances processing to step S9.

Next, in step S9, the control section 1, with the aggregate temporary error region RE as the pattern data density error region RE for the true error region, makes the color of the region corresponding to the pattern data density error region RE in the pattern layout data stored in the output processing section 7 different from that for the other normal regions. Then, the output processing section 7, displays on the pattern layout data by means of a CRT, an image of the pattern data density error region RE, in a color which is clearly different compared to that for regions where the pattern data density is normal, and then advances processing to step S10. Here, to facilitate discrimination of the region corresponding to the pattern data density error region RE from other normal regions, then instead of changing the color, a hatching may be made different.

Next, in step S10, the control section 1 judges if judgment has been made for all of the temporary error regions obtained in step S6 as to whether or not these have a size greater than the 400 μm square. At this time, the control section 1 detects that judgment has not been made with respect to the temporary error region RD and the temporary error region RF as to whether or not these have a size greater than the 400 μm square, and thus returns the processing to step S7.

Then in step S7, the error region width computation processing section 6 based on instructions from the control section 1, computes the width in the X direction and the Y direction of the temporary error region RD, and advances processing to step S8.

Next in step S8, the control section 1, based on the width in the X direction and the Y direction of the temporary error region RD obtained by the error region width computation processing section 6, successively judges if this temporary error region RD has a size greater than the 400 μm square being the previously set pattern data density error region.

At this time, the control section 1, since the widths in the X direction and the Y direction of the temporary error region RD are both below 400 μm, that is to say the temporary error region RD does not have a size greater than the 400 μm square being the pattern data density error region, rejects the temporary error region RD, and then advances processing to step S10.

Next, in step S10, the control section 1 judges if judgment has been made for all of the aggregate temporary error regions obtained in step S6 as to whether or not these aggregate temporary error regions have a size greater than the 400 μm square. The above processing of step S7 through step S10 is repeated, and when the control section 1 judges that judgment has been made for all of the aggregate temporary error regions obtained in step S6 as to whether or not these have a size greater than the 400 μm square, a final pattern data density error region as shown in FIG. 5 is obtained, and the processing of the flow chart of FIG. 3 terminated, thus completing the detection of the pattern data density error regions.

After this, the operator, based on images on a CRT where the pattern data density error regions are shown in a clearly different color compared to regions where the pattern data density is normal, performs correction of the pattern layout data of the corresponding parts, so as to eliminate regions of high density of pattern layout data used for producing a mask employed in a subsequent photolithography step, to thereby prevent the occurrence of global differences in a semiconductor device.

As described above, according to the pattern data density inspection apparatus of the first embodiment, since the measurement of the pattern data density is performed while moving the detection range of the 100 μm square in 10 μm increments in the X direction and the Y direction, the situation as with the conventional example, where the region where the pattern data density is erroneous, is averaged out by spanning over the lattice of the detection range so that this is not detected, can be prevented. Furthermore, since the pattern data density error region having a pattern data density substantially above a predetermined threshold value (for example 50%) is obtained at a detection accuracy of a 10 μm×100 μm interval, an aggregate temporary error region RE of high accuracy, that is, the pattern data density error region RE is obtained.

Moreover, according to the pattern data density inspection apparatus of the first embodiment, to detect pattern data density error regions having a size greater than a previously set error judgment reference shape (for example a 400 μm square), unnecessary error regions such as the aggregate temporary error region RD and the aggregate temporary error region RF in FIG. 4, which do not reach the error judgment reference shape for producing a global difference having the height dg which is the cause of a drop in reliability of the semiconductor device, can be omitted. Therefore only the aggregate temporary error regions related to global differences having a height which actually lowers the reliability can be judged as the pattern data density error regions. Hence detection results of high accuracy for the pattern data density error regions which require correction can be obtained, enabling an improvement in the efficiency of the correction processing for the pattern layout data by the operator.

The pattern data density for error detection is described in the above embodiment as 50%. However the numerical value is not limited to 50%, and may be changed as required.

In the description of the above embodiment, the comparison pattern layout, that is the error judgment reference shape, is described as being a square shape. However the error judgment reference shape is not limited to a square shape and an optional shape such as a rectangle or circle may be used.

Furthermore, in the description of the above mentioned embodiment, the detection range for the pattern data density used in detecting the pattern data density error region, is described as being a 100 μm square, and the error judgment reference shape is described as being a 400 μm square. However if the design rule or the condition of the planarization apparatus is changed, this can be suitably changed to a detection range and error judgment reference shape for the pattern data density, of a required dimension and shape.

Furthermore, a program for executing the respective steps in the flow chart shown in FIG. 3 may be stored on a computer readable recording medium, and the program stored on this recording medium then read by a computer system and executed to thereby perform the figure display processing. Here "computer system" includes hardware such as an OS (operating system) and peripheral devices. Furthermore, "computer readable recording medium" means a portable medium such as a floppy disc, a magneto-optical disc, a ROM (read only memory), or a CD (compact disc)-ROM, or a storage device such as a hard disc incorporated into a computer system.

Moreover, "computer readable recording medium" also includes a product which retains a program dynamically over a short time interval such as with a communication line in the case of sending a program via a communication circuit such as a network like the Internet or a telephone line, and a medium which retains a program for a fixed time such as with a volatile memory inside a computer system which becomes the server or client for this case. Furthermore, the above mentioned program may be one for realizing a part of the aforementioned function. Moreover, the aforementioned function may be realized by combining with a program which is already stored in a computer system.

In the above an embodiment of the present invention has been described in detail with reference to the drawings. However the specific construction is not limited to this embodiment, and the present invention also includes design changes of a scope which do not depart from the gist of the present invention.

The pattern data density inspection apparatus according to the first aspect of the invention, comprises: a pattern data density computing device for obtaining for each of predetermined distance displacements for overlapping detection ranges of a predetermined area, a pattern data density showing a ratio of a total area of pattern data for wiring inside these detection ranges to the area; a temporary error region detection device for taking a logical sum of the detection ranges where the pattern data density is above a previously set threshold value, and obtaining a temporary pattern data density error region; and an error region detection device for making the temporary pattern data density error region of a shape completely containing a previously set pattern data density error figure in plan view, a pattern data density error region. Therefore the situation as with the conventional example, where the region where the pattern data density is erroneous, is averaged out by spanning over the lattice of the detection range so that this is not detected, can be prevented. Furthermore, since the temporary pattern data density error region having a pattern data density substantially above a predetermined threshold value is obtained at a high detection accuracy, a temporary pattern data density error region of high accuracy, that is, the pattern data density error region is obtained. Moreover, to detect pattern data density error regions having a size greater than a previously set error judgment reference shape, unnecessary error regions which do not reach the error judgment reference shape for participating in the production of a global difference having the height which reduces reliability, can be omitted. Therefore, only the aggregate temporary error regions related to global differences which actually lower the reliability can be judged as the pattern data density error regions. Hence detection results of high accuracy for the pattern data density error regions can be obtained, enabling an improvement in the efficiency of the correction of the pattern layout data by the operator.

According to the pattern data density inspection apparatus of the second aspect, since the area of the pattern data for wiring which is less than a predetermined pattern width is excluded from the total area for obtaining the pattern data density, unnecessary area is excluded from the area for computing the pattern data density. Therefore, the pattern data density error regions which actually produce the global difference can be accurately obtained, enabling an improvement in the accuracy of detecting the pattern data density error regions.

According to the pattern data density inspection apparatus of the third aspect, the pattern data density computing device computes the pattern data density for each of the predetermined distance displacements of the detection ranges for either of the X direction and the Y direction. Therefore there is the effect that the situation as with the conventional example, where the region where the pattern data density is erroneous is averaged out by spanning over the lattice so that this is not detected, can be prevented. Furthermore, there is the effect that since the temporary pattern data density error region having a pattern data density substantially above a predetermined threshold value is obtained, a temporary pattern data density error region of high accuracy, that is, the pattern data density error region is obtained.

According to the pattern data density inspection apparatus of the fourth aspect, there is provided an output device for outputting the pattern data density error region and another normal pattern data region, in different colors. Therefore in the output device, a comparison of the pattern data density error regions and the regions where the pattern data density is normal can be easily performed based on the images which are shown in clearly different colors. Hence there is the effect that the operation efficiency in the correction process for the layout pattern, of the parts requiring correction is improved.

The pattern data density inspection method of the fifth aspect has: a first step where a pattern data density computing device obtains for each of predetermined distance displacements for overlapping detection ranges of a predetermined area, a pattern data density showing a ratio of a total area of pattern data for wiring inside these detection ranges to the area; a second step where a temporary error region detection device takes a logical sum of the detection ranges where the pattern data density is above a previously set threshold value, and obtains a temporary pattern data density error region; and a third step where an error region detection device makes the temporary pattern data density error region of a shape completely containing a previously set pattern data density error figure in plan view, a pattern data density error region. Therefore the situation as with the conventional example, where the region where the pattern data density is erroneous, is averaged out by spanning over the lattice of the detection range so that this is not detected, can be prevented. Furthermore, since the temporary pattern data density error region having a pattern data density substantially above a predetermined threshold value is obtained at a high detection accuracy, a temporary pattern data density error region of high accuracy, that is, the pattern data density error region is obtained. Moreover, to detect pattern data density error regions having a size greater than a previously set error judgment reference shape, unnecessary error regions which do not reach the error judgment reference shape for participating in the production of a global difference having the height which reduces reliability, can be omitted. Therefore only the temporary pattern error density error regions related to global differences which actually lower the reliability can be judged as the pattern data density error regions. Hence detection results of high accuracy for the pattern data density error regions can be obtained, enabling an improvement in the efficiency of the correction of the pattern layout data by the operator.

According to the pattern data density inspection apparatus of the sixth aspect, since the area of the pattern data for wiring which is less than a predetermined pattern width is excluded from the total area for obtaining the pattern data density, unnecessary area is excluded from the area for computing the pattern data density. Therefore, the pattern data density error regions which actually produce the global difference can be accurately obtained, enabling an improvement in the accuracy of detecting the pattern data density error regions.

According to the pattern data density inspection apparatus of the seventh aspect, the pattern data density computing device computes the pattern data density for each of the predetermined distance displacements of the detection ranges for either of the X direction and the Y direction. Therefore there is the effect that the situation as with the conventional example, where the region where the pattern data density is erroneous is averaged out by spanning over the lattice so that this is not detected, can be prevented. Furthermore, there is the effect that since the temporary pattern data density error region having a pattern data density substantially above a predetermined threshold value is obtained, a temporary pattern data density error region of high accuracy, that is, the pattern data density error region is obtained.

According to the pattern data density inspection apparatus of the eighth aspect, there is provided an output device for outputting the pattern data density error region and another normal pattern data region, in different colors. Therefore in the output device, a comparison of the pattern data density error regions and the regions where the pattern data density is normal can be easily performed based on the images which are shown in clearly different colors. Hence there is the effect that the operation efficiency in the correction process for the layout pattern, of the parts requiring correction is improved.

The recording medium of the ninth aspect of the invention is the computer readable recording medium on which is recorded the pattern data density inspection program for performing pattern data density inspection, wherein the pattern data density inspection program performs on a computer: a process where a pattern data density computing device while effecting displacement for overlapping detection ranges of a predetermined area, obtains pattern data densities showing a ratio of a total area of pattern data for wiring inside these detection ranges to the area; a process where a temporary error region detection device takes a logical sum of the detection ranges where the pattern data density is above a previously set threshold value, and obtains a temporary pattern data density error region; and a process where an error region detection device makes the temporary pattern data density error region of a shape completely containing a previously set pattern data density error figure in plan view, a pattern data density error region. Therefore the situation as with the conventional example, where the region where the pattern data density is erroneous, is averaged out by spanning over the lattice of the detection range so that this is not detected, can be prevented. Furthermore, since the temporary pattern data density error region having a pattern data density substantially above a predetermined threshold value is obtained at a high detection accuracy, a temporary pattern data density error region of high accuracy, that is, the pattern data density error region is obtained. Moreover, to detect pattern data density error regions having a size greater than a previously set error judgment reference shape, unnecessary error regions which do not reach the error judgment reference shape for participating in the production of a global difference having the height which reduces reliability, can be omitted. Therefore, only the temporary pattern error density error regions related to global differences which actually lower the reliability can be judged as the pattern data density error regions. Hence detection results of high accuracy for the pattern data density error regions can be obtained, enabling an improvement in the efficiency of the correction of the pattern layout data by the operator.

What is claimed is:

1. A pattern density inspection apparatus comprising:
pattern density computing means for obtaining for each of predetermined distance displacements for overlapping detection ranges of a predetermined area, a pattern density function showing a ratio of a total area of pattern data for wiring inside said detection ranges to said area;
temporary error region detection means for taking a logical sum of said detection ranges where said pattern data density is above a previously set threshold value, and obtaining a temporary pattern data density error region; and
error region detection means for making said temporary pattern data density error region of a shape completely containing a previously set pattern data density error figure in plan view, a pattern data density error region.

2. The pattern data density inspection apparatus according to claim 1, wherein an area of said pattern data for wiring which is less than a predetermined pattern width is excluded from said total area for obtaining the pattern data density.

3. The pattern data density inspection apparatus according to claim 1, wherein said pattern data density computing means computes said pattern data density for each of the predetermined distance displacements of said detection ranges for either of an X direction and a Y direction.

4. The pattern data density inspection apparatus according to claim 1, wherein there is provided output means for outputting said pattern data density error region and another normal pattern data region, in different colors.

5. A pattern data density inspection method having:
a first step where a pattern data density computing means obtains for each of predetermined distance displacements for overlapping detection ranges of a predetermined area, a pattern data density showing a ratio of a total area of pattern data for wiring inside said detection ranges to said area;
a second step where a temporary error region detection means takes a logical sum of said detection ranges where said pattern data density is above a previously set threshold value, and obtains a temporary pattern data density error region; and
a third step where an error region detection means makes said temporary pattern data density error region of a shape completely containing a previously set pattern data density error figure in plan view, a pattern data density error region.

6. The pattern data density inspection method according to claim 5, wherein an area of said pattern data for wiring which is less than a predetermined pattern width is excluded from said total area for obtaining the pattern data density.

7. The pattern data density inspection method according to claim 5, wherein said pattern data density computing means computes said pattern data density for each of the predetermined distance displacements of said detection ranges for either of an X direction and a Y direction.

8. The pattern data density inspection method according to claim 5, wherein there is provided output means for outputting said pattern data density error region and another normal pattern data region, in different colors.

9. A computer readable recording medium on which is recorded a pattern data density inspection program for performing pattern data density inspection using a pattern data density inspection apparatus, wherein said pattern data density inspection program performs on a computer, said computer readable recording medium comprising:

a process where a pattern data density computing means, while effecting displacement for overlapping detection ranges of a predetermined area, obtains pattern data densities showing a ratio of a total area of pattern data for wiring inside said detection ranges to said area;

a process where a temporary error region detection means takes a logical sum of said detection ranges where said pattern data density is above a previously set threshold value, and obtains a temporary pattern data density error region; and a process where an error region detection means makes said temporary pattern data density error region of a shape completely containing a previously set pattern data density error figure in plan view, a pattern data density error region.

10. The pattern data density inspection apparatus of claim 1, wherein said previously set threshold value is fifty percent.

11. The pattern data density inspection apparatus of claim 2, wherein said pattern data density error region approximates a first square and said total area approximates a second square larger than said first square.

12. The pattern data density inspection apparatus of claim 11, wherein said first square has a width of approximately 100 micrometers and said second square has a width of approximately 400 micrometers.

13. The pattern data density inspection apparatus of claim 12, wherein said predetermined distance displacements are in successive 10 micrometer increments.

14. The pattern data density inspection apparatus of claim 2, wherein said total area approximates a shape that is one of: a circle and a rectangle.

15. The pattern data density inspection method of claim 5, wherein said previously set threshold value is fifty percent.

16. The pattern data density inspection apparatus of claim 6, wherein said pattern data density error region approximates a first square and said total area approximates a second square larger than said first square.

17. The pattern data density inspection apparatus of claim 16, wherein said first square has a width of approximately 100 micrometer and said second square has a width of approximately 400 micrometers.

18. The pattern data density inspection apparatus of claim 17, wherein said predetermined distance displacements are in successive 10 micrometer increments.

19. The pattern data density inspection apparatus of claim 6, wherein said total area approximates a shape that is one of: a circle and a rectangle.

* * * * *